United States Patent
Horii et al.

(10) Patent No.: US 9,363,459 B2
(45) Date of Patent: Jun. 7, 2016

(54) ELECTRONIC APPARATUS

(71) Applicant: KABUSHIKI KAISHA TOSHIBA, Tokyo (JP)

(72) Inventors: Yasuyuki Horii, Ome (JP); Yasuyuki Suzuki, Tachikawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 693 days.

(21) Appl. No.: 13/724,206

(22) Filed: Dec. 21, 2012

(65) Prior Publication Data

US 2013/0335644 A1 Dec. 19, 2013

(30) Foreign Application Priority Data

Jun. 14, 2012 (JP) ................................. 2012-134969

(51) Int. Cl.
*H04N 7/18* (2006.01)
*H04N 5/64* (2006.01)
*H05K 5/02* (2006.01)
*G06F 1/16* (2006.01)

(52) U.S. Cl.
CPC ................ *H04N 5/64* (2013.01); *G06F 1/1601* (2013.01); *G06F 1/1637* (2013.01); *H05K 5/0217* (2013.01)

(58) Field of Classification Search
CPC ....................................................... H04N 5/64
USPC ....................................................... 348/836
See application file for complete search history.

(56) References Cited

U.S. PATENT DOCUMENTS

| | | | |
|---|---|---|---|
| 6,411,501 B1 * | 6/2002 | Cho et al. | 361/679.27 |
| 2007/0153454 A1 * | 7/2007 | Chang et al. | 361/681 |
| 2009/0140963 A1 * | 6/2009 | Okumura et al. | 345/87 |
| 2009/0267266 A1 | 10/2009 | Lee et al. | |
| 2010/0014025 A1 * | 1/2010 | Teragawa | 349/64 |
| 2011/0013111 A1 * | 1/2011 | Wang et al. | 349/58 |
| 2011/0075356 A1 | 3/2011 | Tanaka et al. | |

FOREIGN PATENT DOCUMENTS

| | | | | |
|---|---|---|---|---|
| JP | 2002099218 A | * | 4/2002 | G09F 9/00 |
| JP | 2002-23220 A | | 8/2002 | |
| JP | 2006-293926 A | | 10/2006 | |
| JP | 2009-262530 A | | 11/2009 | |
| JP | 2011-070488 A | | 4/2011 | |
| JP | 2012-010414 A | | 1/2012 | |

OTHER PUBLICATIONS

Office Action dated Jun. 4, 2013 issued in corresponding Japanese Application No. 2012-134969, along with its English translation.

* cited by examiner

*Primary Examiner* — Andy Rao
(74) *Attorney, Agent, or Firm* — Knobbe, Martens, Olson & Bear, LLP

(57) ABSTRACT

According to one embodiment, an electronic apparatus includes a housing and a component. The housing includes a synthetic resin portion and a metal portion. The synthetic resin portion includes a first portion exposed to an outside of the electronic apparatus and a second portion including a nip portion. The metal portion overlaps the second portion from an outer side and covers the nip portion. The component is in the housing and faces the nip portion.

14 Claims, 14 Drawing Sheets

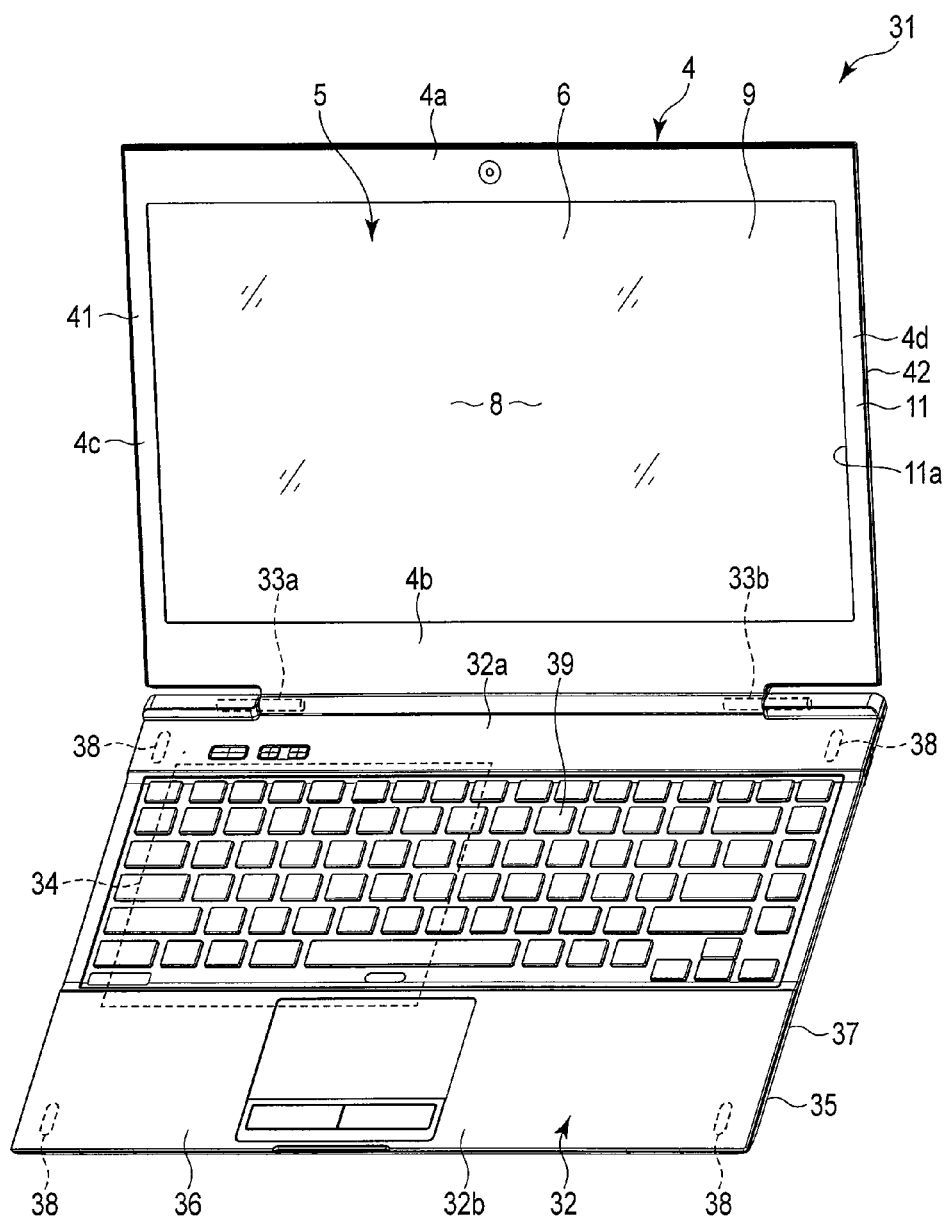
F I G. 3

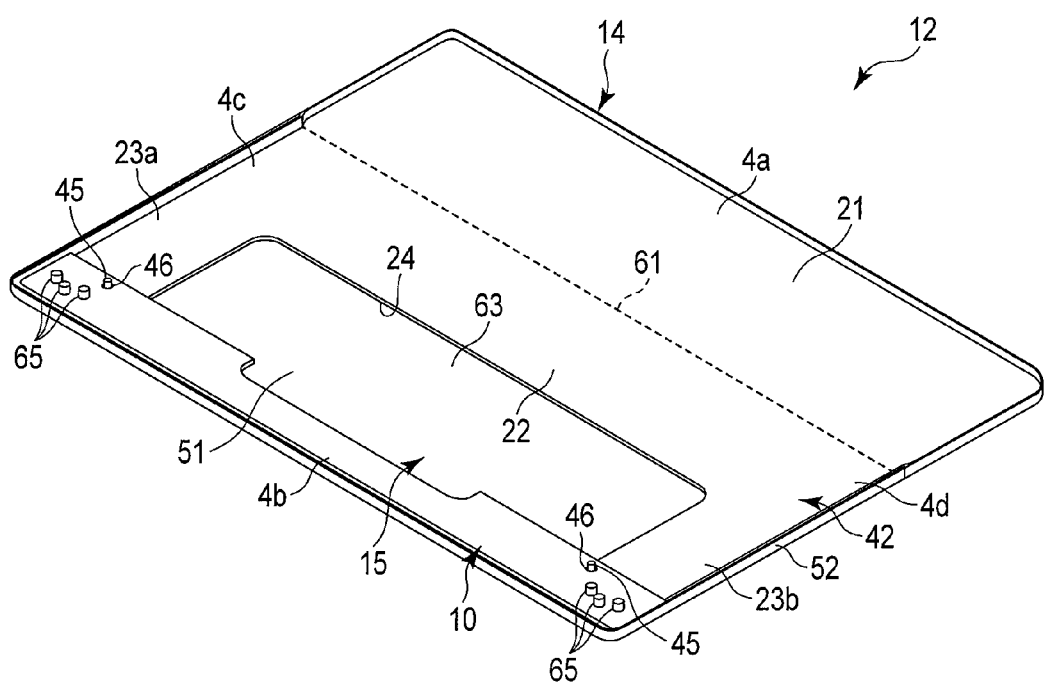
F I G. 7

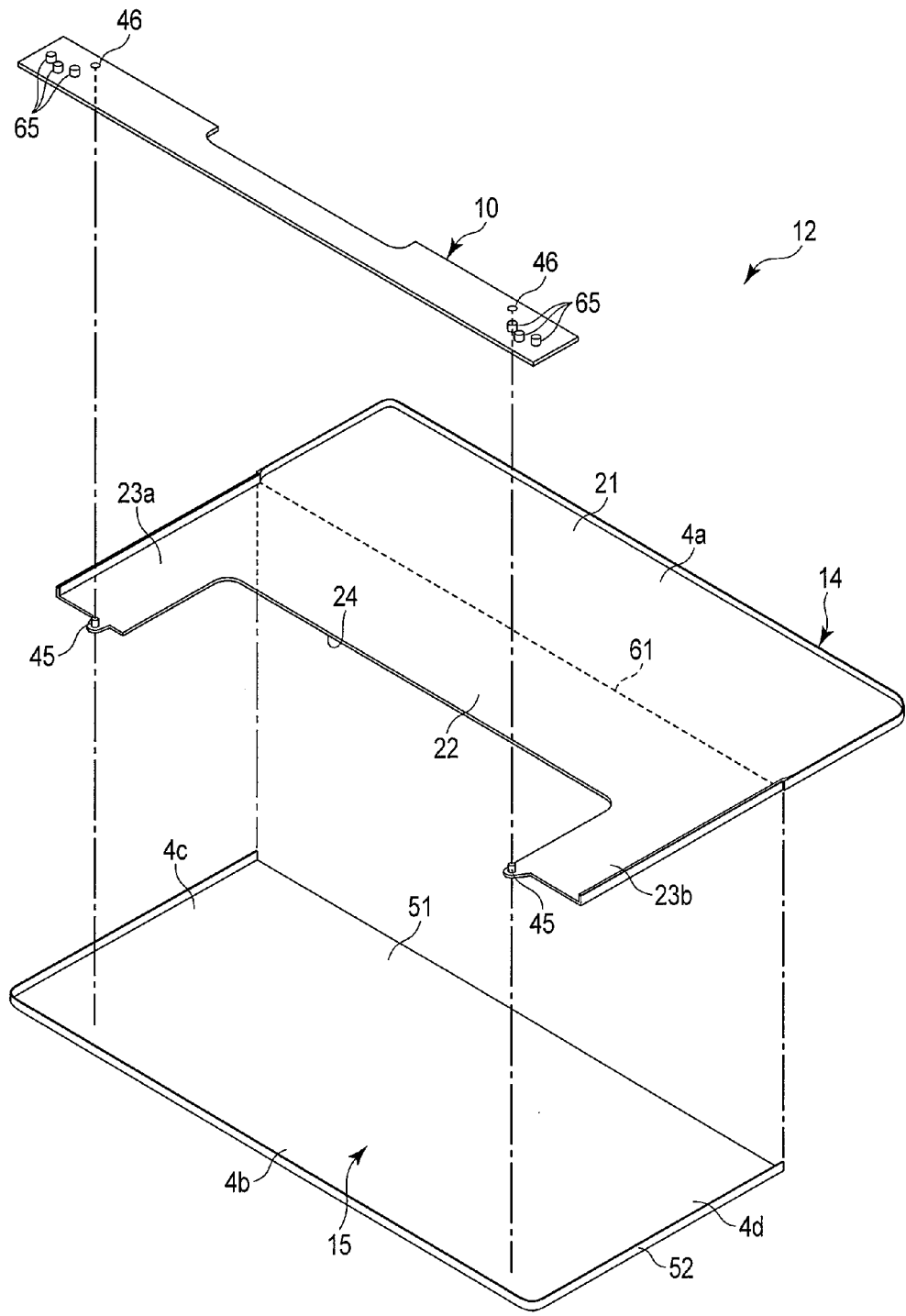
F I G. 8

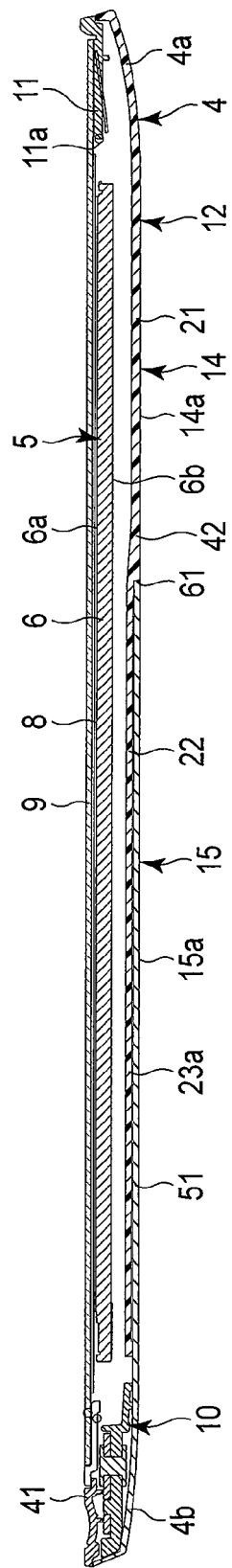
F I G. 11

# ELECTRONIC APPARATUS

CROSS-REFERENCE TO RELATED APPLICATIONS

This application is based upon and claims the benefit of priority from Japanese Patent Application No. 2012-134969, filed Jun. 14, 2012, the entire contents of which are incorporated herein by reference.

FIELD

Embodiments described herein relate generally to electronic apparatuses including televisions.

BACKGROUND

Electronic apparatuses with a metal housing and a plastic antenna cover have been provided.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 3 is an exemplary perspective view of an electronic apparatus according to a second embodiment;

FIG. 7 is an exemplary perspective view illustrating an inner surface of the back cover illustrated in FIG. 3;

FIG. 8 is an exemplary exploded perspective view of the back cover illustrated in FIG. 3;

FIG. 11 is an exemplary cross-sectional view taken along the line F11-F11, of the first housing illustrated in FIG. 6;

DETAILED DESCRIPTION

Various embodiments will be described hereinafter with reference to the accompanying drawings.

In general, according to one embodiment, an electronic apparatus comprises a housing and a component. The housing comprises a synthetic resin portion and a metal portion. The synthetic resin portion comprises a first portion exposed to an outside of the electronic apparatus and a second portion comprising a nip portion. The metal portion overlaps the second portion from an outer side and covers the nip portion. The component is in the housing and faces the nip portion.

Hereinafter, embodiments will be described with reference to the accompanying drawings. In this specification, some components are expressed by two or more terms. Those terms are just examples. Those components may be further expressed by another or other terms. And the other components which are not expressed by two or more terms may be expressed by another or other terms.

First Embodiment

Figure 1:
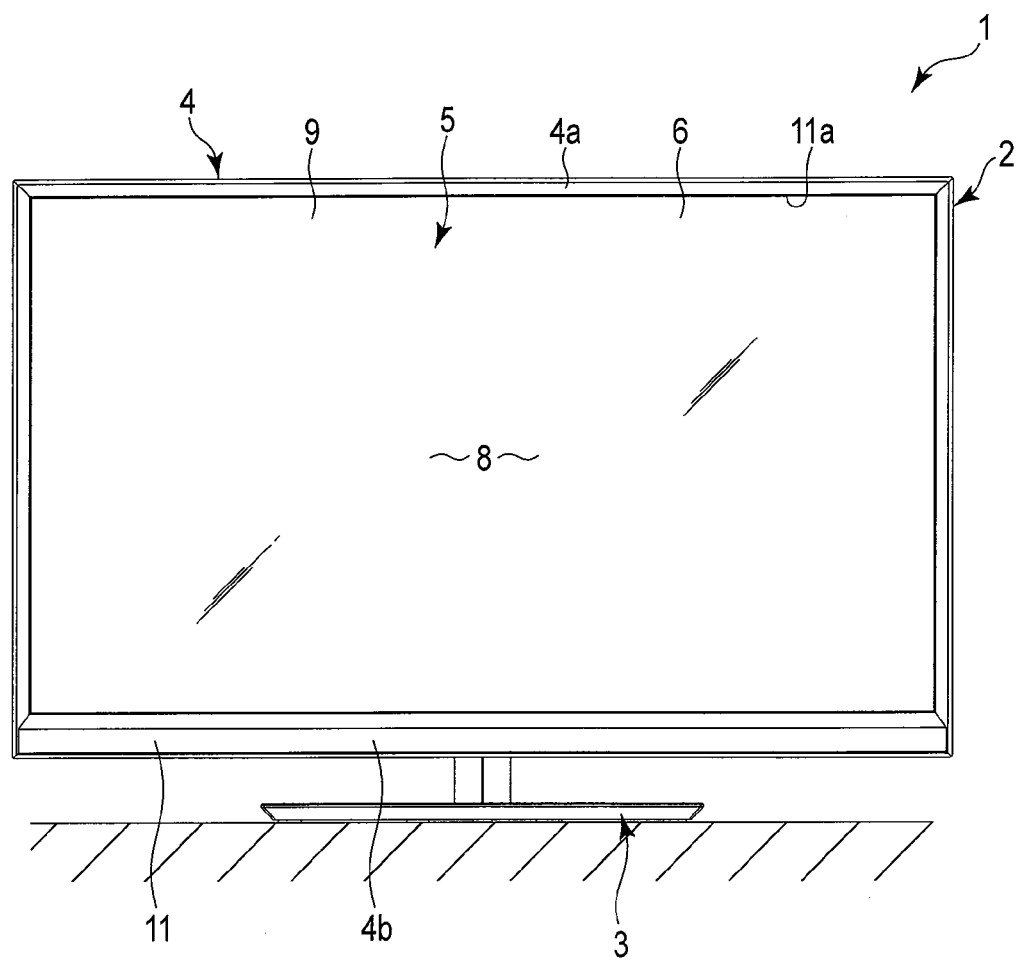
FIG. 1 is an exemplary front view of a television according to a first embodiment.
Figure 2:
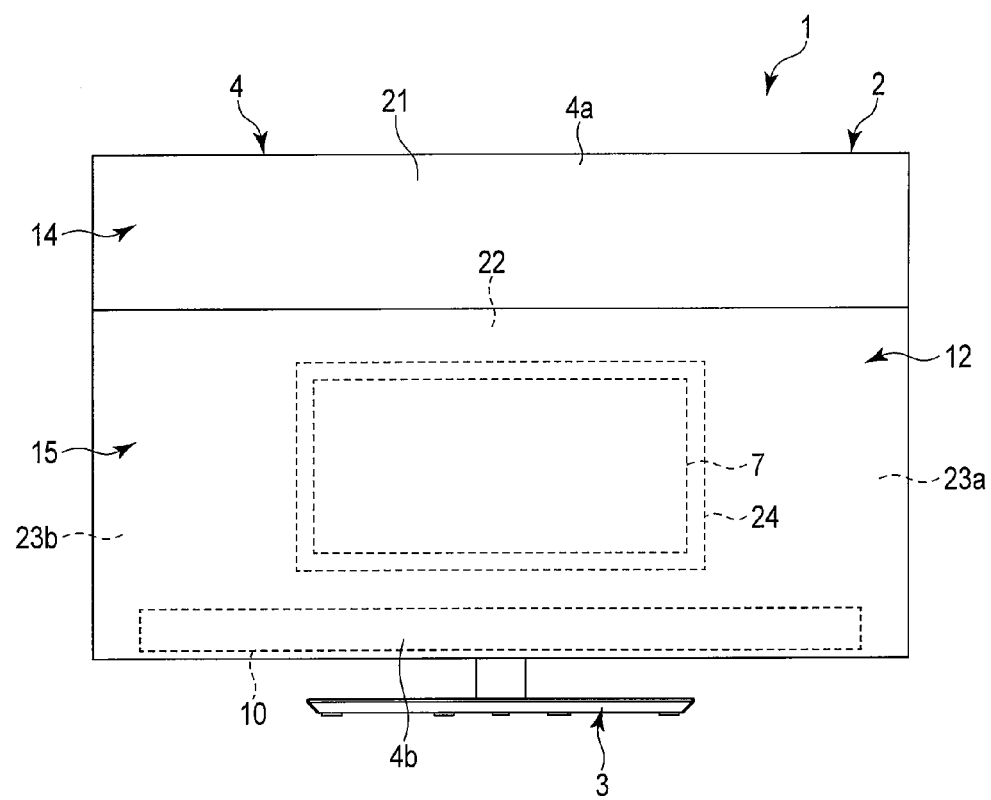
FIG. 2 is an exemplary rear view of the television illustrated in FIG. 1.

FIGS. 1 and 2 illustrate a television 1 according to the first embodiment. The television 1 is an example of an "electronic apparatus." The television 1 includes a display unit 2 and a stand 3 (i.e., a supporting portion or a table) that supports the display unit 2.

As illustrated in FIG. 1, the display unit 2 includes a flat box-like housing 4 and a display 5 that is accommodated in the housing 4. The display 5 includes a display panel 6 (i.e., a display portion or a display) and a circuit board 7.

The display panel 6 includes a first surface that includes a display screen 8 and a second surface that is positioned on a side opposite to the first surface, and has a planar shape. A touch panel 9 (e.g., a transparent panel with a touch sensor) overlaps the first surface of the display panel 6. The panel that overlaps the first surface of the display panel 6 may be a protection panel that does not include a touch sensor or a panel for other purposes.

As illustrated in FIG. 2, the circuit board 7 is attached to the second surface of the display panel 6. An example of the circuit board 7 is a control substrate (i.e., a driving substrate) that is electrically connected to the display panel 6 and the touch panel 9 so as to control driving of the display panel 6 and the touch panel 9.

The housing 4 includes a first end portion 4a and a second end portion 4b. The first end portion 4a is an upper end portion, for example. The second end portion 4b is positioned on a side opposite to the first end portion 4a. The second end portion 4b is a lower end portion, for example. A reinforcing portion 10 is provided in the second end portion 4b.

As illustrated in FIGS. 1 and 2, the housing 4 includes a front cover 11 (e.g., a mask) and a back cover 12 (e.g., a cover). An opening 11a through which the display screen 8 is exposed is formed in the front cover 11. The front cover 11 constitutes a front wall of the housing 4.

The back cover 12 faces the display panel 6 from a side opposite to the front cover 11. The back cover 12 constitutes a back wall (i.e., a rear wall) and a side wall (i.e., a circumferential wall) of the housing 4. The back cover 12 includes a synthetic resin portion 14 (a synthetic resin member, a plastic member, a first member, or a first component) and a metal portion 15 (i.e., a metal member, a second member, or a second component).

The synthetic resin portion 14 includes a first portion 21, a second portion 22, and a pair of third portions 23a and 23b. The first portion 21 is exposed to the outside at the first end portion 4a of the housing 4 and faces the second surface of the display panel 6. The second portion 22 extends from the first portion 21 and faces the second surface of the display panel 6. The pair of third portions 23a and 23b is positioned to be divided at both sides of the circuit board 7. The pair of third portions 23a and 23b faces the second surface of the display panel 6 and is connected to the reinforcing portion 10 at the second end portion 4b of the housing 4.

A nip portion 24 (i.e., a space region or a space portion) that faces the circuit board 7 is formed between the pair of third portions 23a and 23b. An example of the nip portion 24 is an opening provided in the synthetic resin portion 14. The nip portion 24 is not limited to the opening but may be a recess formed on the synthetic resin portion 14. The metal portion 15 is exposed to the outside and covers the second portion 22 and the third portions 23a and 23b of the synthetic resin portion 14, and the nip portion 24 from the outer side.

A detailed structure of the television 1 is approximately the same as that of an electronic apparatus 31 according to a second embodiment. Therefore, the electronic apparatus 31 according to the second embodiment will be described in detail, and detailed description of the television 1 will not be provided. In the second embodiment, configurations having the same or similar functions as those of the first embodiment will be denoted by the same reference numerals.

Second Embodiment

Next, the electronic apparatus 31 according to the second embodiment will be described with reference to FIGS. 3 to 13. As illustrated in FIG. 3, the electronic apparatus 31 according to the present embodiment is a notebook-type portable computer (i.e., note PC), for example. Electronic apparatuses to which the embodiments described herein can be applied are not limited to the above examples. The embodiments described herein can be broadly applied to various electronic apparatuses such as, for example, a television, a tablet-type (i.e., slate-type) portable computer, a mobile phone (including a smart phone), or a game machine.

As illustrated in FIG. 3, the electronic apparatus 31 includes a first housing 4, a second housing 32, and hinges 33a and 33b. The first housing 4 and the second housing 32 form an outer body (i.e., an exterior member) of the electronic apparatus 31 and are exposed to the outside of the electronic apparatus 31. The first housing 4 and the second housing 32 form a part of the external surface (i.e., an outer surface or a surface perceived by a user) of the electronic apparatus 31.

The first housing 4 is a display housing, for example. The first housing 4 accommodates the display 5 (i.e., a display device, a display module, or a unit). An example of the display 5 is a liquid crystal display, but is not limited to this. The first housing 4 will be described in detail later.

The second housing 32 is a main housing, for example. A circuit board 34 serving as a main board, for example, is accommodated in the second housing 32. The second housing 32 includes a first wall 35 (e.g., a lower wall or a bottom wall), a second wall 36 (e.g., an upper wall), and a third wall 37 (e.g., a circumferential wall or a side wall), and has a flat box-like shape.

The first wall 35 faces a table surface (i.e., a mounting surface, an outer surface, an outer mounting surface) when the electronic apparatus 31 is placed on a table, for example. The first wall 35 includes a plurality of legs 38 (i.e., supporting portions), for example. The legs 38 make contact with the table surface and support the electronic apparatus 31 when the electronic apparatus 31 is placed on the table.

The second wall 36 is positioned on a side opposite to the first wall 35. The second wall 36 extends approximately in parallel with the first wall 35, for example. An input portion 39 (i.e., an input receiving portion), for example, is provided on the second wall 36. A keyboard is an example of the input portion 39. The input portion 39 is not limited to the keyboard but may be a touch panel (i.e., a touch sensor), for example, or other input devices. The third wall 37 extends in a direction crossing (e.g., substantially orthogonal to) the first wall 35 and the second wall 36 and connect a peripheral edge of the first wall 35 and a peripheral edge of the second wall 36.

The second housing 32 includes a first end portion 32a (e.g., a rear end portion) and a second end portion 32b (e.g., a front end portion). The hinges 33a and 33b are connected to the first end portion 32a. The second end portion 32b is positioned on a side opposite to the first end portion 32a. Herein, the directions up, down, left, and right are defined as seen from the user. Moreover, the side closer to the user is defined as "front," and the side further from the user is defined as "rear."

Next, a configuration of the first housing 4 (hereinafter referred to as the housing 4) will be described in detail.

As illustrated in FIG. 3, the housing 4 includes a first end portion 4a and a second end portion 4b. The first end portion 4a is an upper end portion, for example. The second end portion 4b is positioned on a side opposite to the first end portion 4a and is a lower end portion, for example. The second end portion 4b is fixed (i.e., connected) to the hinges 33a and 33b and is supported by the hinges 33a and 33b.

The hinges 33a and 33b rotatably (i.e., openably) connect the second end portion 4b of the first housing 4 and the first end portion 32a of the second housing 32. In this way, the electronic apparatus 31 can be opened (i.e., folded). The electronic apparatus 31 can be deformed into a first state where the first housing 4 and the second housing 32 overlap each other and a second state where the first housing 4 and the second housing 32 are open so that the display screen 8 is exposed to the outside.

Figure 4:
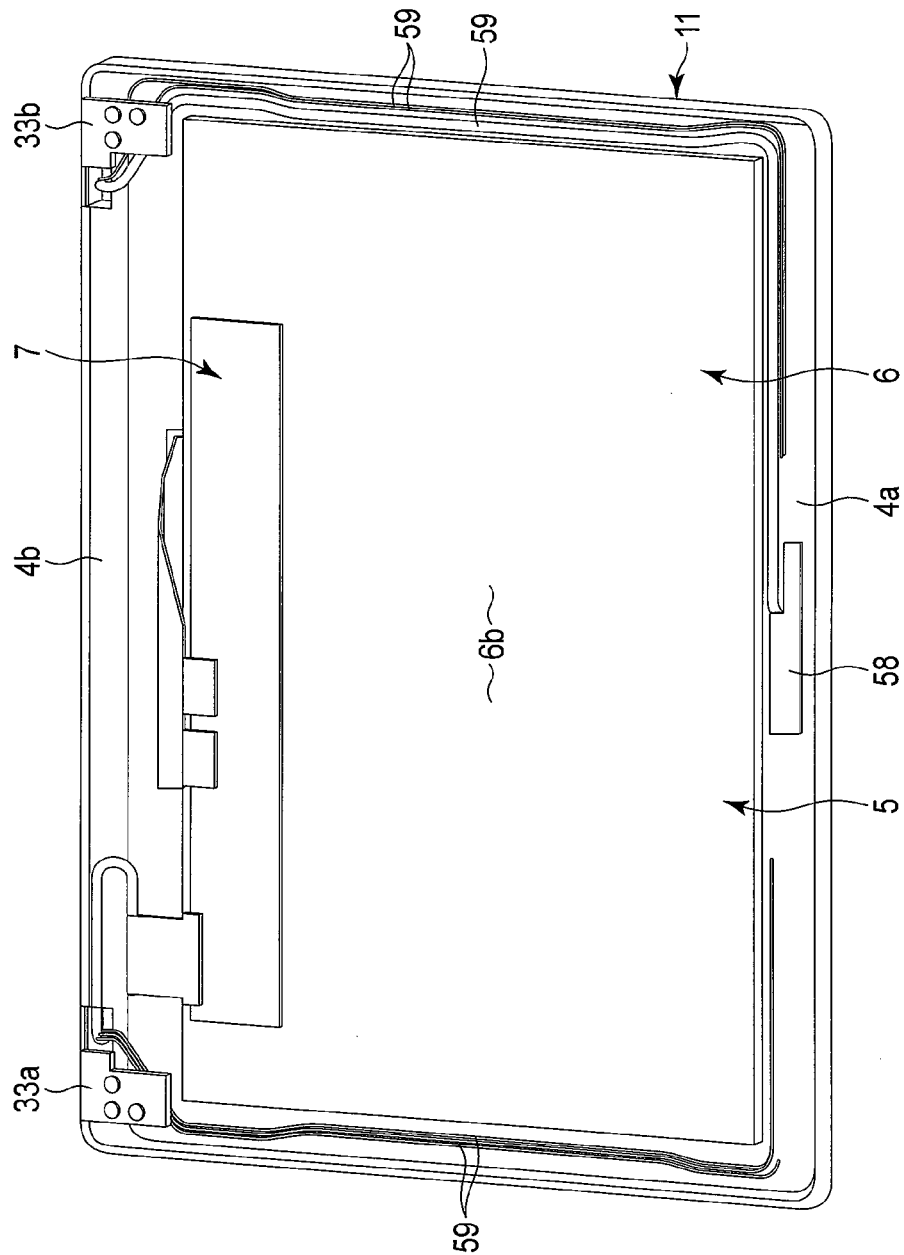
FIG. 4 is an exemplary perspective view illustrating an inner portion of a first housing illustrated in FIG. 3.

As illustrated in FIGS. 3 and 4, the display 5 includes a display panel 6 (i.e., a display portion or a display) and a circuit board 7. The display panel 6 includes a first surface 6a that includes the display screen 8 and a second surface 6b that is positioned on a side opposite to the first surface 6a, and has a planar shape. A touch panel 9 (i.e., a transparent panel with a touch sensor) overlaps the first surface 6a of the display panel 6. The first surface 6a of the display panel 6 is covered with the touch panel 9. The panel that overlaps the first surface 6a of the display panel 6 may be a protection panel that does not have a touch sensor or a panel for other purposes.

As illustrated in FIG. 4, the circuit board 7 is attached to the second surface 6b of the display panel 6. An example of the circuit board 7 is a control substrate (i.e., a driving substrate) that is electrically connected to the display panel 6 and the touch panel 9 so as to control driving of the display panel 6 and the touch panel 9. That is, in the present embodiment, a control circuit of the touch panel 9 is formed in the circuit board 7.

As illustrated in FIG. 4, in the present embodiment, the display panel 6 and the circuit board 7 overlap each other in a thickness direction of the housing 4. The circuit board 7 overlaps the display panel 6 from a side opposite to the touch panel 9. The circuit board 7 is closer to the second end portion 4b than to the first end portion 4a of the housing 4, for example. The circuit board 7 is an example of a "component." A component attached to the second surface 6b of the display panel 6 is not limited to the circuit board but may be other components and members.

As illustrated in FIG. 3, the housing 4 includes a first wall 41 (e.g., a front wall), a second wall 42 (e.g., a back wall or a rear wall), and a third wall 43 (e.g., a side wall or a circumferential wall), and has a flat box-like shape. The first wall 41 includes an opening 11a through which the display screen 8 (i.e., the first surface 6a) is exposed. The opening 11a is positioned between the first end portion 4a and the second end portion 4b. The first wall 41 faces the first surface 6a of the display panel 6.

The second wall 42 is positioned on a side opposite to the first wall 41 and extends approximately in parallel with the first wall 41. The second wall 42 faces the second surface 6b of the display panel 6. The third wall 43 extends in a direction crossing (e.g., substantially orthogonal to) the first wall 41 and the second wall 42 and connects a peripheral edge of the first wall 41 and a peripheral edge of the second wall 42. Herein, the directions up, down, front, and rear, of the second housing 32 are defined based on a state where the second housing 32 is erected.

Figure 5:
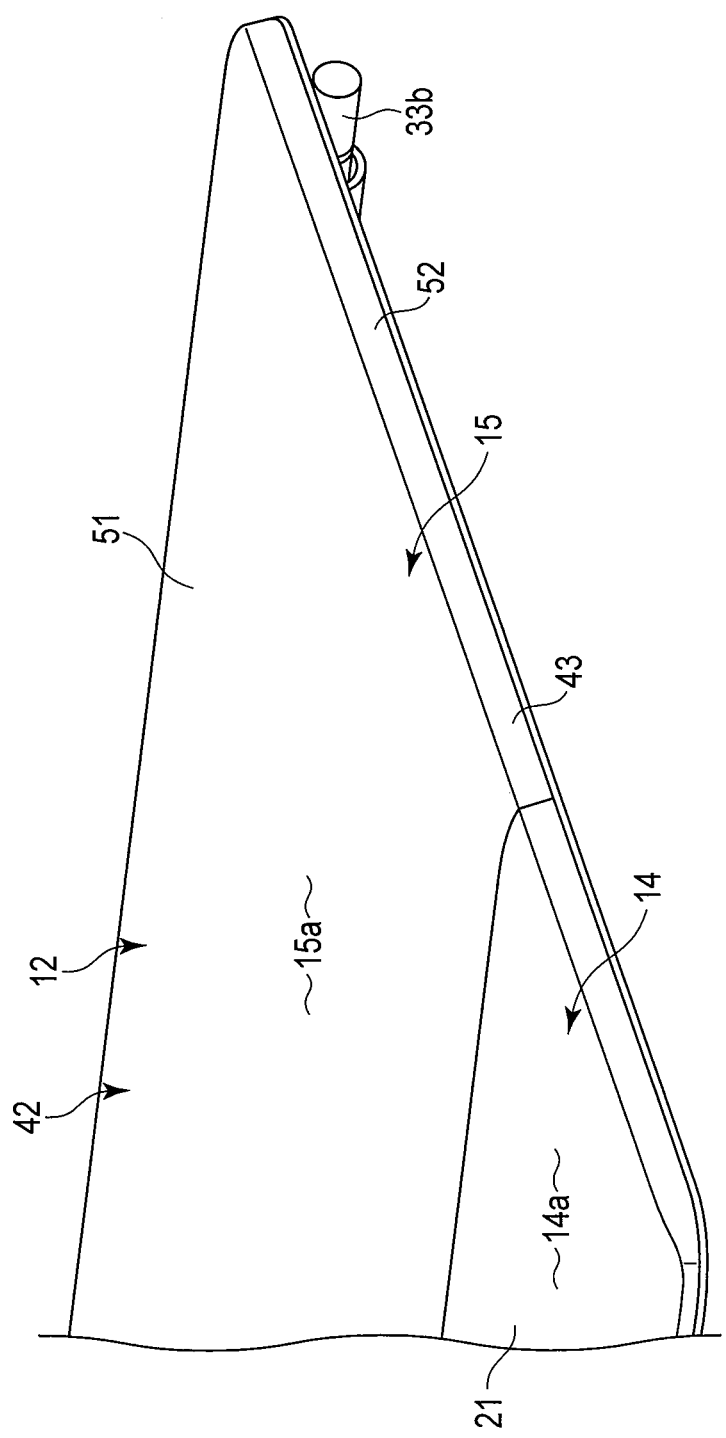
FIG. 5 is an exemplary perspective view illustrating a back cover of the first housing illustrated in FIG. 3.

As illustrated in FIGS. 4 and 5, the housing 4 includes a front cover 11 (i.e., a mask, a first cover, a first member, or a first component) and a back cover 12 (i.e., a cover, a base, a second cover, a second member, or a second component). The front cover 11 includes the first wall 41.

The back cover 12 faces the display panel 6 from a side opposite to the front cover 11. The back cover 12 includes the second wall 42 and the third wall 43 of the housing 4. The back cover 12 includes a synthetic resin portion 14 (i.e., a synthetic resin member, a plastic member, a first member, or a first component) and a metal portion 15 (i.e., a metal member, a second member, or a second component). That is, in the present embodiment, the synthetic resin portion 14 and the metal portion 15 are combined to form the back cover 12. The metal portion 15 is made from aluminum, for example, and has higher rigidity than the synthetic resin portion 14. The material of the metal portion 15 is not limited to the above.

As illustrated in FIGS. 6 to 9, the synthetic resin portion 14 includes a first portion 21, a second portion 22, and a pair of third portions 23a and 23b. The first portion 21 is exposed to the outside at the first end portion 4a of the housing 4 and constitutes a portion of the outer body (i.e., an outer surface or a front surface) of the electronic apparatus 31. The first portion 21 faces the second surface 6b of the display 5.

The second portion 22 extends from the first portion 21 toward the second end portion 4b of the housing 4. The second portion 22 is covered with the metal portion 15 from the outer side and is not exposed to the outside, which will be described in detail later. The second portion 22 faces the second surface 6b of the display 5. The second portion 22 faces a central portion (i.e., a central portion of the second surface 6b) of the display 5, for example.

The pair of third portions 23a and 23b extends from the second portion 22 toward the second end portion 4b of the housing 4. The pair of third portions 23a and 23b is positioned to be divided on both sides of the circuit board 7. The pair of third portions 23a and 23b is divided in the longitudinal direction of the circuit board 7.

Here, the housing 4 includes a third end portion 4c and a fourth end portion 4d that extend between the first end portion 4a and the second end portion 4b. The third end portion 4c is a left end portion, for example. The fourth end portion 4d is positioned on a side opposite to the third end portion 4c, and is a right end portion, for example. The third end portion 4c and the fourth end portion 4d extend in a direction crossing (e.g., substantially orthogonal to) the first end portion 4a and the second end portion 4b.

The third portion 23a extends along the third end portion 4c of the housing 4. The third portion 23b extends along the fourth end portion 4d of the housing 4. The third portions 23a and 23b are covered with the metal portion 15 from the outer side and are not exposed to the outside, which will be described in detail later. The third portions 23a and 23b face the second surface 6b of the display 5.

As illustrated in FIGS. 6 to 9, the electronic apparatus 31 includes a reinforcing portion 10 (i.e., a supporting portion or a hinge attachment portion). The reinforcing portion 10 is provided in the second end portion 4b of the housing 4. The reinforcing portion 10 is made from metal, for example, and has higher rigidity than the synthetic resin portion 14. An example of the reinforcing portion 10 is made from a magnesium alloy.

The reinforcing portion 10 extends along the second end portion 4b of the housing 4. The reinforcing portion 10 extends over substantially the entire width of the second end portion 4b of the housing 4. The reinforcing portion 10 extends in the longitudinal direction of the circuit board 7. The reinforcing portion 10 is longer than the circuit board 7. The reinforcing portion 10 is thicker than the metal portion 15 and has higher rigidity than the metal portion 15, for example.

The pair of third portions 23a and 23b extends up to the second end portion 4b of the housing 4, for example, and is connected (i.e., joined) to the reinforcing portion 10 at the second end portion 4b. Specifically, an end portion of each of the third portions 23a and 23b includes a projection 45 (i.e., a first engaging portion or a pin) that protrudes in the thickness direction of the housing 4. The reinforcing portion 10 includes an engaging portion 46 (i.e., a second engaging portion) that engages with the projection 45. The engaging portion 46 is a hole (e.g., through hole) or a recess. When the projection 45 engages with the engaging portion 46, the third portions 23a and 23b and the reinforcing portion 10 are connected.

As illustrated in FIGS. 6 to 9, a nip portion (i.e., a space region, a space portion, or an opening) that faces the circuit board 7 is provided between the pair of third portions 23a and 23b. In the present embodiment, the nip portion 24 is a recess that is formed in the synthetic resin portion 14, for example. The circuit board 7 is positioned on an inner side of the nip portion 24. The nip portion 24 is not limited to the recess, but may be an opening as in the first embodiment.

In the present embodiment, the nip portion 24 is positioned between the second portion 22 of the synthetic resin portion 14 and the reinforcing portion 10. That is, the nip portion 24 is surrounded by the second portion 22, the pair of third portions 23a and 23b, and the reinforcing portion 10 from four directions.

As illustrated in FIGS. 6 to 9, the metal portion 15 is exposed to the outside at the central portion and the second end portion 4b of the housing 4 and constitutes a portion of the outer body (i.e., an outer surface or a front surface) of the electronic apparatus 31. The metal portion 15 covers the second portion 22 and the third portions 23a and 23b of the synthetic resin portion 14, the nip portion 24, and the reinforcing portion 10 from the outer side. That is, the metal portion 15 covers the space (i.e., region) between the pair of third portions 23a and 23b. A portion of the metal portion 15 faces the circuit board 7 through the nip portion 24.

The second portion 22 and the third portions 23a and 23b of the synthetic resin portion 14 are fixed to the metal portion 15. In the present embodiment, the synthetic resin portion 14 is surface-fixed to the metal portion 15 by an adhesive agent. That is, in the present embodiment, the synthetic resin portion 14 includes three side portions (the second portion 22 and the third portions 23a and 23b) that extend so as to surround the circuit board 7 from three directions, and these three side portions are bonded to the metal portion 15. In other words, with the second portion 22 and the third portions 23a and 23b, a relatively large adhesion region (adhesion area) is secured. A method of fixing the synthetic resin portion 14 is not limited to the above method, and for example, a double-sided adhesive tape or the other fixing methods may be used.

As illustrated in FIG. 8, the metal portion 15 is a plate that includes a flat portion 51 (i.e., a plate portion or a flat portion)

and a peripheral portion 52 (i.e., a peripheral end portion, an edge portion, an end portion, or a portion) that rises from an end portion of the flat portion 51. The metal portion 15 is formed by subjecting a flat plate to spinning processing, for example. An example of the metal portion 15 has a simple shape and does not have a projection, an engaging portion, and the like on the inner side of the flat portion 51.

The reinforcing portion 10 is fixed to the flat portion 51 of the metal portion 15. The reinforcing portion 10 is fixed to the metal portion 15 by an adhesive agent, for example. A method of fixing the reinforcing portion 10 is not limited to the above method, and for example, a double-side adhesive tape or the other fixing methods may be used.

Figure 6:
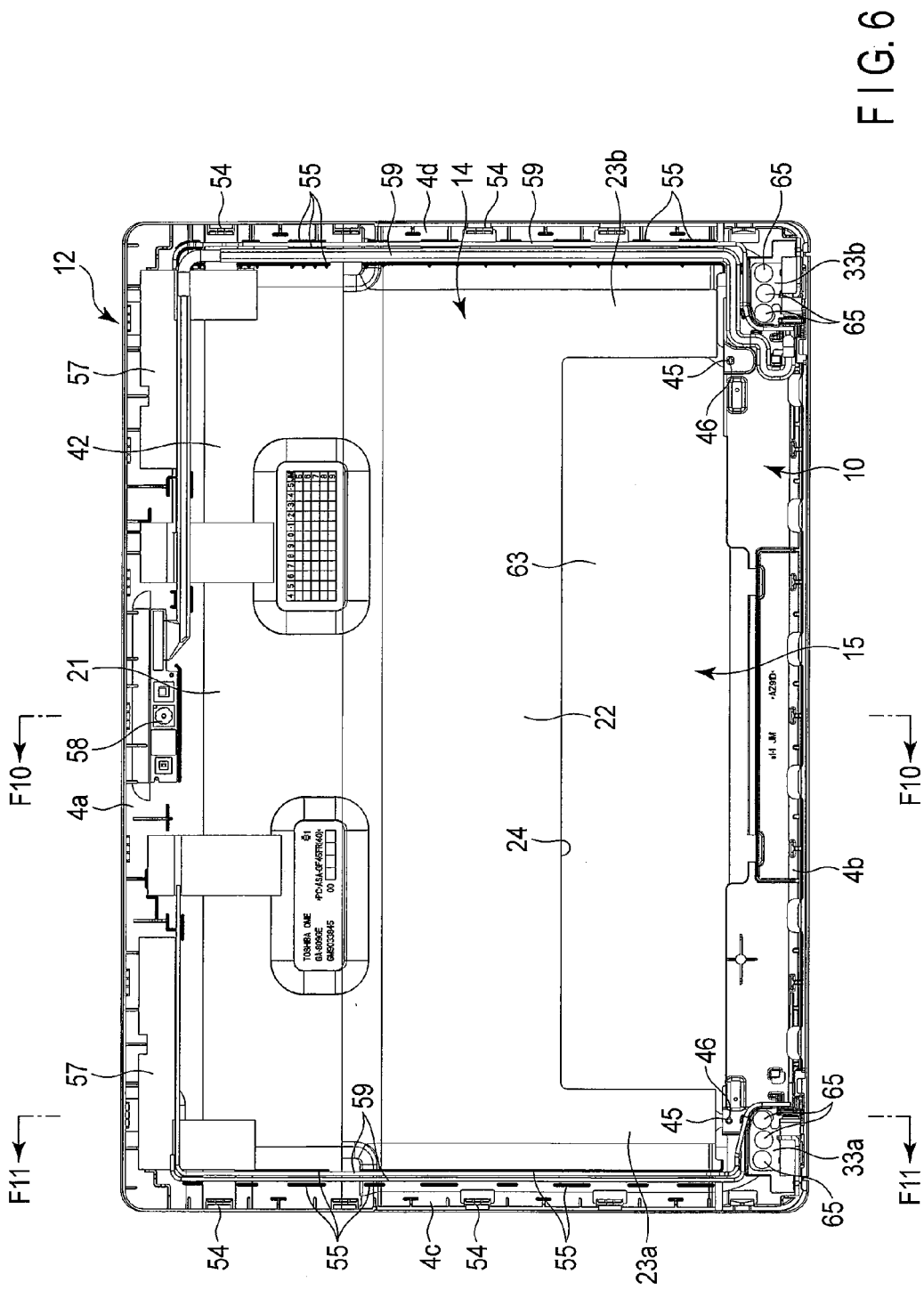
FIG. 6 is an exemplary plan view illustrating the inner portion of the first housing illustrated in FIG. 3.
Figure 9:
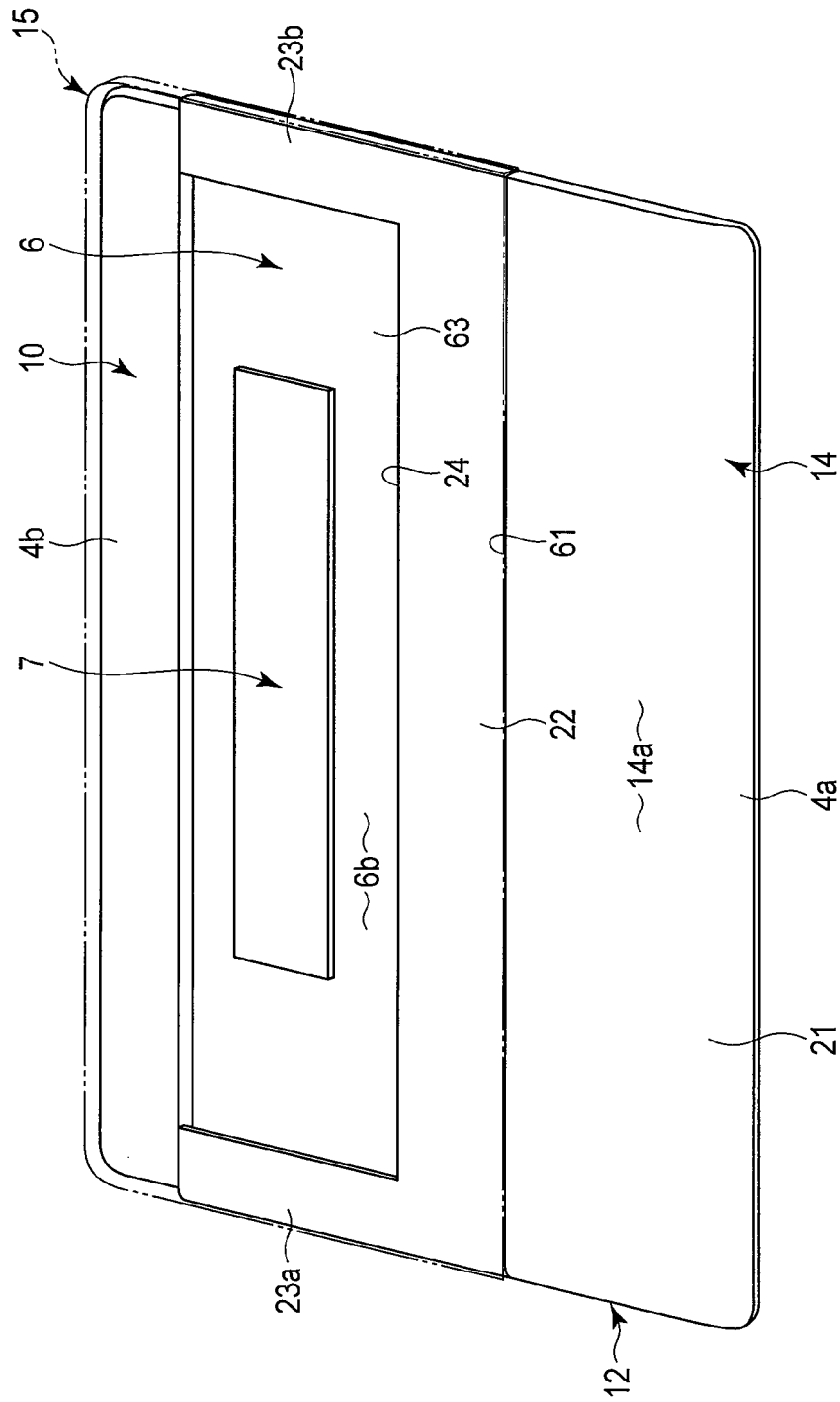
FIG. 9 is an exemplary perspective view illustrating the inner portion of the first housing illustrated in FIG. 3.

On the other hand, as illustrated in FIG. 6, each of the first portion 21, the second portion 22, and the third portions 23a and 23b of the synthetic resin portion 14 includes a first engaging portion 54 (i.e., a first supporting portion) that protrudes into the inner side of the housing 4 and a second engaging portion 55 (i.e., a second supporting portion). The first engaging portion 54 is a hook (e.g., a claw portion), for example. The first engaging portion 54 engages with the engaging portion (e.g., a claw portion) of the front cover 11. In other words, the first engaging portion 54 and the second engaging portion 55 which have a complex shape are provided on the synthetic resin portion 14, and the metal portion 15 has a simple structure which can be formed by spinning processing.

As illustrated in FIG. 6, a first module 57 and a second module 58 are accommodated in the housing 4. Each of the first module 57 and the second module 58 includes a cable 59. The second engaging portion 55 is attached to the cable 59 and supports the cable 59.

The first module 57 is an antenna, for example. The second module 58 is a camera module, for example. The first module 57 and the second module 58 are positioned at the first end portion 4a of the housing 4, which are not covered with the metal portion 15. For example, the first module 57 which is an antenna transmits and receives electromagnetic waves to and from the outside through the first portion 21 of the synthetic resin portion 14. In other words, the first portion 21 of the synthetic resin portion 14 includes the function of an antenna cover.

Figure 10:
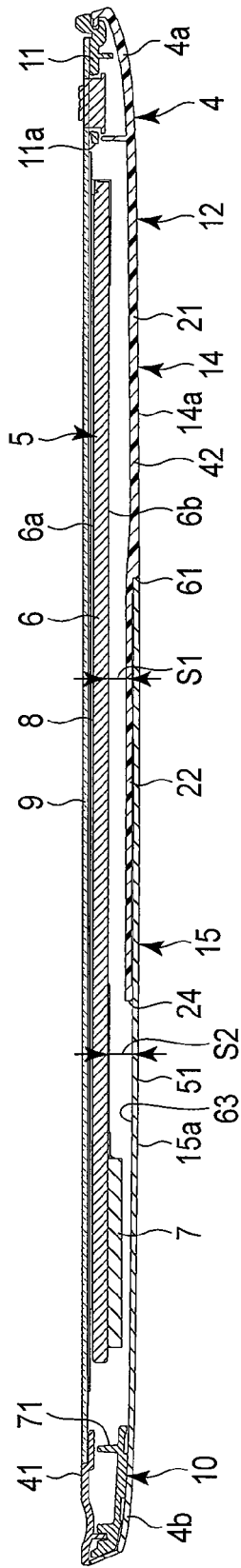
FIG. 10 is an exemplary cross-sectional view taken along the line F10-F10, of the first housing illustrated in FIG. 6.

As illustrated in FIG. 10, the second portion 22 of the synthetic resin portion 14 is thinner than the first portion 21. A step 61 is formed at the boundary between the first portion 21 and the second portion 22. As illustrated in FIG. 11, the third portions 23a and 23b of the synthetic resin portion 14 have substantially the same thickness as the second portion 22 and are thinner than the first portion 21. That is, the third portions 23a and 23b have a step in relation to the first portion 21 similarly to the second portion 22 and are smoothly connected to the second portion 22.

As illustrated in FIGS. 10 and 11, the metal portion 15 (i.e., the flat portion 51) is thinner than the first portion 21 of the synthetic resin portion 14. An example of the thickness of the metal portion 15 is substantially the same as that of the step 61 between the first portion 21 and the second portion 22. The metal portion 15 is attached to the step 61 and covers the second portion 22 and the third portions 23a and 23b. A surface 15a (e.g., a front surface or an outer surface) of the metal portion 15 is substantially continuous to a surface 14a (e.g., a front surface or an outer surface) of the first portion 21.

In this way, as illustrated in FIG. 10, the inner surface of the housing 4 includes a depression 63 (i.e., a recess) that is depressed toward the outer side of the housing 4 and is disposed in a region of the inner surface corresponding to a position (i.e., the nip portion 24) between the pair of third portions 23a and 23b. That is, the inner surface of the housing 4 includes the depression 63 that increases the inner space of the housing 4 and is disposed in a region corresponding to the circuit board 7. The depression 63 is formed due to the step between the third portions 23a and 23b and the metal portion 15 (i.e., the flat portion 51). The depth of the depression 63 corresponds to the depth of the third portions 23a and 23b, for example.

Specifically, the housing 4 includes a first space S1 (i.e., a first portion or a first region) and a second space S2 (i.e., a second portion or a second region). The first space S1 is positioned between the second surface 6b of the display panel 6 and the second portion 22 of the synthetic resin portion 14. The second space S2 is positioned between the pair of third portions 23a and 23b and between the second surface 6b of the display panel 6 and the metal portion 15. The second space S2 is wider than the first space S1 in the thickness direction of the housing 4.

Figure 12:
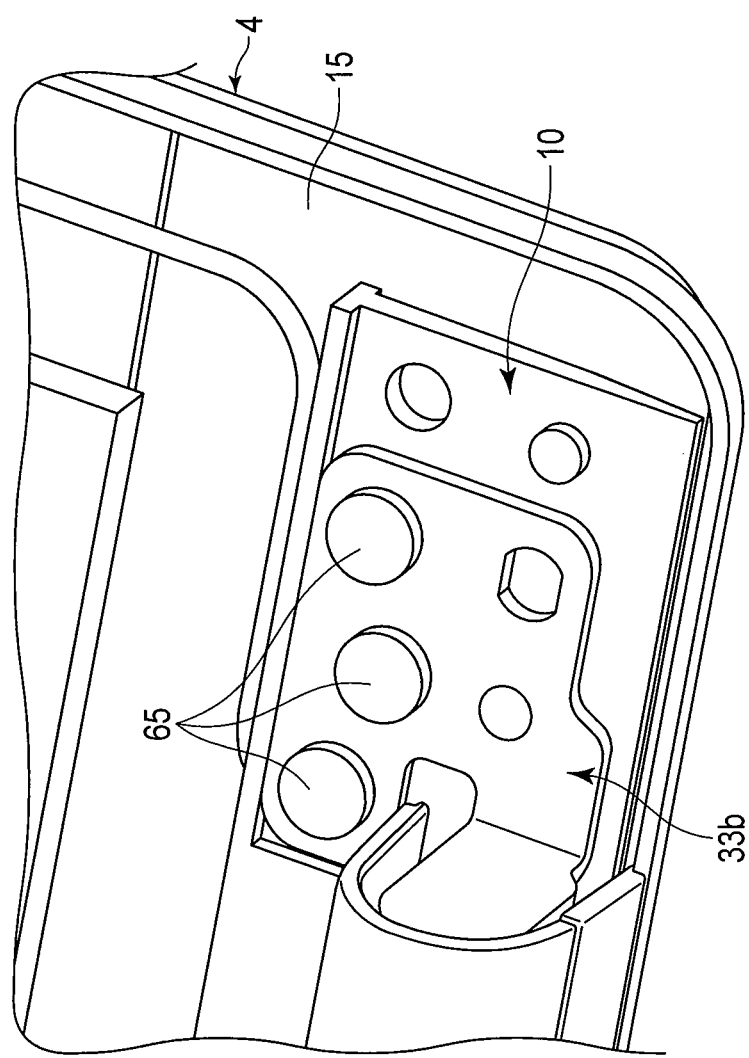
FIG. 12 is an exemplary perspective view illustrating a portion of a reinforcing portion illustrated in FIG. 7 in an enlarged scale.

As illustrated in FIGS. 7 and 12, the reinforcing portion 10 includes a plurality of engaging portions 65, for example. The engaging portion 65 is a projection (e.g., pin) that protrudes in the thickness direction of the housing 4, for example. This projection is a caulking rivet, for example. As illustrated in FIG. 12, the hinges 33a and 33b are fixed to the engaging portion 65. The hinges 33a and 33b are fixed to the metal portion 15 via the reinforcing portion 10.

In this way, force applied from the user to the first end portion 4a of the first housing 4 when the user opens and closes the electronic apparatus 31 is transmitted to the hinges 33a and 33b via the first portion 21, the second portion 22, and the third portions 23a and 23b of the synthetic resin portion 14, the metal portion 15, and the reinforcing portion 10.

Figure 13:
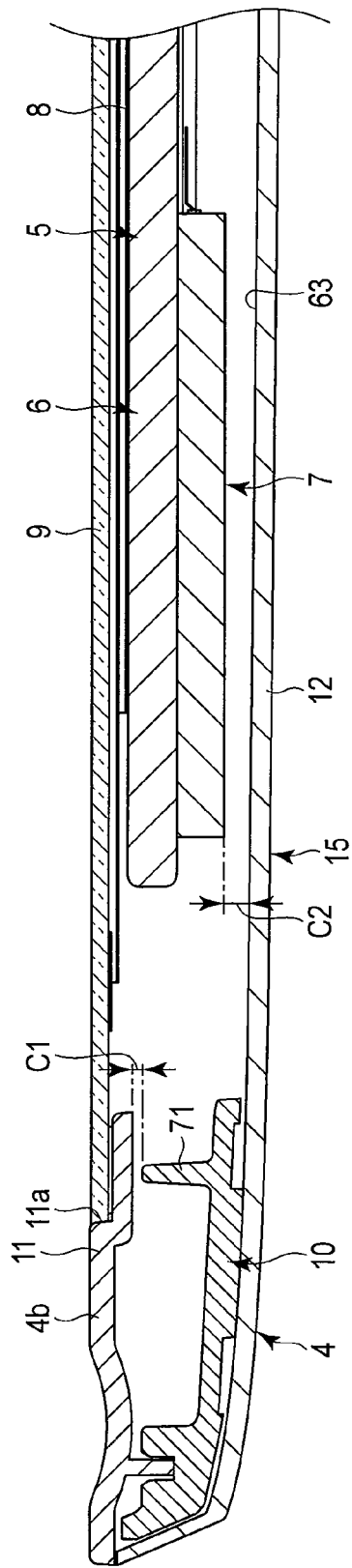
FIG. 13 is an exemplary cross-sectional view illustrating a portion of the first housing illustrated in FIG. 10 in an enlarged scale.

As illustrated in FIG. 13, the reinforcing portion 10 includes a projection 71 (e.g., a rib) that protrudes in the thickness direction of the housing 4. A gap C1 between the distal end of the projection 71 and the inner surface of the housing 4 is smaller than a gap C2 between the circuit board 7 and the inner surface of the housing 4.

The projection 71 is an example of a portion that is configured to make contact with the inner surface of the housing earlier than the circuit board 7 that makes contact with the inner surface of the housing 4 when the housing 4 is deformed. The projection 71 makes contact with the inner surface of the housing 4 when the housing 4 is deformed, further deformation of the housing 4 is suppressed, and the circuit board 7 is suppressed from making contact with the inner surface of the housing 4.

According to such a configuration, it is possible to decrease the thickness of the electronic apparatus 31.

In the present embodiment, the electronic apparatus 31 includes the housing 4 and a component (e.g., the circuit board 7) accommodated in the housing 4. The housing 4 includes the synthetic resin portion 14 and the metal portion 15. The synthetic resin portion 14 includes the first portion 21 that is exposed to the outside and the second portion in which the nip portion 24 is provided. The "second portion" as used herein means a portion of the synthetic resin portion 14 that is covered with the metal portion 15 and corresponds to a region including the second portion 22 and the third portions 23a and 23b in the above embodiment. The metal portion 15 overlaps the second portion from the outer side and covers the nip portion 24. The component faces the nip portion 24.

According to such a configuration, it is possible to form the depression 63 that increases the inner space of the housing 4 in a region corresponding to the component attached to the second surface 6b of the display panel 6 while securing the strength of the housing 4 with the metal portion 15. Since the depression 63 can absorb part of or the entire thickness of the component (e.g., the circuit board 7), it is possible to decrease the thickness of the housing 4. In this way, it is possible to decrease the thickness of the electronic apparatus 31.

Further, as in the present embodiment, when the synthetic resin portion 14 and the metal portion 15 are exposed to the outside, various decorations can be formed using a difference between the characteristics of the synthetic resin portion 14 and the metal portion 15. Specifically, a decorative pattern such as fine lines may be formed on the synthetic resin portion 14. A surface treatment such as alumite treatment may be performed on the metal portion 15 so as to have a metallic surface. By combining two different kinds of members, the degree of freedom of design increases and the design property of the electronic apparatus 31 can be increased. Further, as in the present embodiment, when the display panel 6 and the circuit board 7 overlap each other in the thickness direction of the housing 4, it is possible to decrease the size of the housing 4.

From another perspective, in the present embodiment, the electronic apparatus 31 includes the first housing 4 and the panel 6 accommodated in the first housing 4. The first housing 4 includes the synthetic resin portion 14 and the metal portion 15, and the opening 11a is formed in the first housing 4. The panel 6 includes the first surface 6a exposed through the opening 11a, the second surface 6b positioned on a side opposite to the first surface 6a, and a component (e.g., the circuit board 7) formed on the second surface 6b.

The synthetic resin portion 14 includes the first portion 21 that faces the second surface 6b of the panel 6 and is exposed to the outside and the pair of second portions positioned to be divided on both sides of the component. The "second portion" as used herein means a portion of the synthetic resin portion 14 that is positioned to be divided on both sides of the component and corresponds to the third portions 23a and 23b in the above embodiment. The metal portion 15 overlaps the pair of second portions from the outer side and covers a space between the pair of second portions.

According to such a configuration, it is possible to form the depression 63 that increases the inner space of the housing 4 in a region of the housing 4 corresponding to the component attached to the second surface 6b of the display panel 6 while securing the strength of the housing 4 with the metal portion 15. In this way, it is possible to decrease the thickness of the electronic apparatus 31.

In the present embodiment, the electronic apparatus 31 further includes the hinges 33a and 33b that connect the first housing 4 and the second housing 32. The hinges 33a and 33b are fixed to the metal portion 15. According to such a configuration, force applied to the hinges 33a and 33b can be received by the metal portion 15 having relatively high strength. In this way, it is possible to further decrease the thickness of the housing 4 and to further decrease the thickness of the electronic apparatus 31.

In the present embodiment, the electronic apparatus 31 includes the reinforcing portion 10 that is formed in the second end portion 4b of the housing 4. The synthetic resin portion 14 includes the first portion 21 that is exposed to the outside at the first end portion 4a of the housing 4 and faces the second surface 6b of the display panel 6, the second portion 22 that extends from the first portion 21 and faces the second surface 6b of the display panel 6, and the pair of third portions 23a and 23b that extends from the second portion 22 to be divided on both sides of the circuit board 7 and is connected to the reinforcing portion 10. The metal portion 15 overlaps the second portion 22 and the pair of third portions 23a and 23b from the outer side and covers the space between the pair of third portions 23a and 23b.

According to such a configuration, the synthetic resin portion 14 extends between the first end portion 4a and the second end portion 4b of the first housing 4. Further, the synthetic resin portion 14 is connected to the reinforcing portion 10. In this way, it is possible to increase the rigidity of the housing 4. As a result, it is possible to further decrease the thickness of the housing 4 and to further decrease the thickness of the electronic apparatus 31.

In the present embodiment, the second portion 22 and the third portions 23a and 23b of the synthetic resin portion 14 are thinner than the first portion 21. Since the second portion 22 and the third portions 23a and 23b are reinforced by being covered with the metal portion 15, it is possible to form the second portion and the third portions to be thinner than the first portion 21. According to such a configuration, it is possible to further decrease the thickness of the electronic apparatus 31.

In the present embodiment, the metal portion 15 is thinner than the first portion 21 of the synthetic resin portion 14. Since the metal portion 15 has relatively high strength, it is possible to secure strength even when the metal portion 15 is thinner than the first portion 21 of the synthetic resin portion 14. In the present embodiment, the region of the housing 4 that covers the circuit board 7 is formed of the metal portion 15 only. According to such a configuration, it is possible to further decrease the thickness of the electronic apparatus 31.

In the present embodiment, the second portion 22 and the third portions 23a and 23b are fixed to the metal portion 15. According to such a configuration, it is possible to fix the synthetic resin portion 14 and the metal portion 15 around the circuit board 7 with high strength. In this way, the rigidity of the housing 4 in the vicinity of the circuit board 7 increases. According to such a configuration, it is easy to protect the circuit board 7 even when the thickness of the housing 4 is decreased.

In the present embodiment, a bonding area of the metal portion 15 and the synthetic resin portion 14 is formed in the vicinity of the circuit board 7. According to such a configuration, it is possible to increase the rigidity of the housing 4 and to further protect the circuit board 7.

In the present embodiment, the reinforcing portion 10 includes a portion (e.g., the projection 71) that makes contact with the inner surface of the housing 4 earlier than the circuit board 7 making contact with the inner surface of the housing 4 when the housing 4 is deformed. According to such a configuration, it is possible to suppress the circuit board 7 from making contact with the inner surface of the housing 4 and to further protect the circuit board 7. According to such a configuration, it is possible to further protect the circuit board 7 even when the thickness of the housing 4 is decreased. The shape of the "portion that makes contact with the inner surface of the housing 4 earlier than the circuit board 7 making contact with the inner surface of the housing 4 when the housing 4 is deformed" is not limited to the projection 71, but other structures and shapes may be used.

In the present embodiment, the metal portion 15 is a plate that includes the flat portion 51 and the peripheral portion 52 that is erected from an end portion of the flat portion 51. On the other hand, the synthetic resin portion 14 includes the engaging portion 54 that engages with the front cover 11. That is, in the present embodiment, all or a larger part of complex-shaped members are formed in the synthetic resin portion 14, and the metal portion 15 is formed in a simple structure that can be formed by spinning processing. This contributes to reducing the cost of the electronic apparatus 31.

In the present embodiment, the circuit board 7 overlaps the display panel 6 at a position closer to a side (e.g., the hinges) opposite to the first module (e.g., the antenna 57). In this way, it is possible to shorten the cable between the circuit board 7 and the touch panel 9.

In the present embodiment, the circuit board 7 overlaps the display panel 6. According to such a configuration, the circuit board 7 rarely becomes an obstacle to drawing of the cables 59 of the first module 57 and the second module 58, for example, and the length of the cables 59 can be decreased.

Third Embodiment

Next, an electronic apparatus 31 according to a third embodiment will be described with reference to FIG. 14. In the third embodiment, configurations having the same or similar functions as those of the first and second embodiments will be denoted by the same reference numerals, and description thereof will not be provided. In addition, configurations other than the following configurations are the same as those of the second embodiment.

Figure 14:
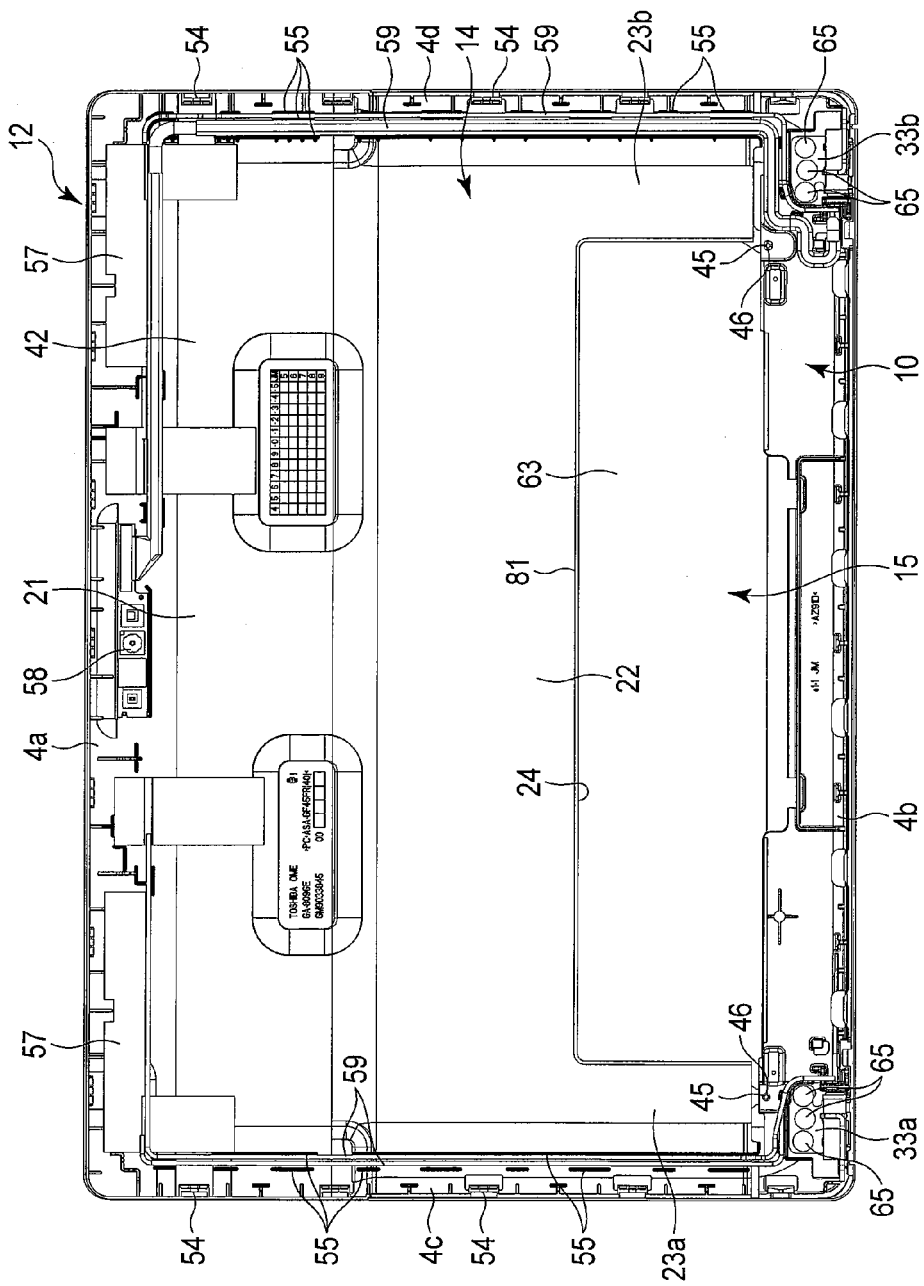
FIG. 14 is an exemplary plan view illustrating an inner portion of a first housing of an electronic apparatus according to a third.

As illustrated in FIG. 14, a synthetic resin portion 14 according to the present embodiment includes a projection 81 (e.g., rib). The projection 81 is formed along the edges of the second portion 22 and the third portions 23a and 23b so as to extend around the circuit board 7. The projection 81 is a connection that extends over the second portion 22 and the third portions 23a and 23b, for example, and surrounds the circuit board 7 from three directions. The projection 81 is an example of the portion that makes contact with the inner surface of the housing earlier than the circuit board 7 making contact with the inner surface of the housing 4 when the housing 4 is deformed. The shape of the projection 81 is not limited to the above.

According to such a configuration, it is possible to decrease the thickness of the electronic apparatus 31 similarly to the second embodiment.

The embodiments are not limited to the embodiments described above but may be realized by modifying constituent elements in the implementing step within a range without departing from the spirit of the invention. Moreover, various embodiments can be made by appropriately combining a plurality of constituent elements disclosed in the embodiments described above. For example, some constituent elements may be omitted from all constituent elements disclosed in the embodiments. Furthermore, constituent elements in different embodiments may be combined appropriately.

For example, the second portion 22 is not an essential constituent component and may be not provided. In this case, the "third portions 23a and 23b" may be referred to as "second portions 23a and 23b." The notations, the first portion 21, the second portion 22, and the third portions 23a and 23b of the synthetic resin portion 14 are used for the sake of convenience, or other notations with different orders may be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
a housing comprising a first end portion, a second end portion opposite the first end portion, an opening between the first end portion and the second end portion, a synthetic resin portion facing an outside of the electronic apparatus at the first end portion, and a metal portion facing the outside of the electronic apparatus at the second end portion;
a display panel comprising a first surface in the opening, a second surface opposite the first surface and facing the synthetic resin portion, and a circuit board on the second surface; and
a reinforcing portion in the second end portion of the housing and made of metal,
wherein
the synthetic resin portion comprises:
a first portion facing the outside of the electronic apparatus at the first end portion and facing the second surface of the panel;
a second portion next to the first portion and between the metal portion and the second surface of the panel; and
a pair of third portions next to the second portion opposite the first portion at both sides of the circuit board,
the reinforcing portion connects tips of the pair of third portions and defines an opening area by surrounding with the second portion and the pair of third portions, and
the metal portion faces the second portion, the pair of third portions, and the reinforcing portion and covers the opening area.

2. The electronic apparatus of claim 1, wherein
the housing further comprises a first wall surrounding the opening and facing the first surface, and a second wall opposite to the first wall and facing the second surface,
the reinforcing portion is attached on an inner surface of the second wall, and comprises a projection configured to contact an inner surface of the first wall of the housing before the circuit board contacts the inner surface of the housing when the housing is deformed.

3. The electronic apparatus of claim 1, wherein
the housing further comprises a front cover comprising the opening,
the metal portion is a plate comprising a flat portion and a peripheral portion on an end of the flat portion, and
the synthetic resin portion further comprises an engaging portion configured to engage the front cover.

4. An electronic apparatus comprising:
a housing comprising a synthetic resin portion, a metal portion, and an opening;
a panel comprising a first surface in the opening, a second surface opposite the first surface, and a component on the second surface; and
a reinforcing portion on the inner surface of the housing and made of metal,
wherein
the synthetic resin portion comprises:
a first portion facing the second surface of the panel and facing an outside of the electronic apparatus;
a second portion next to the first portion and between the metal portion and the second surface of the panel; and
a pair of third portions at both sides of the component and connected to the reinforcing portion respectively, the reinforcing portion connects tips of the pair of the third portions and defines one side of an opening area by surrounding with the second portion and the pair of the third portion, and the metal portion faces the second portion, the pair of third portions, and the reinforcing portion and covers the opening area.

5. The electronic apparatus of claim 1, wherein
the circuit board comprises a long side along the second end portion, and
the reinforcing portion is arranged along the second end portion.

6. The electronic apparatus of claim 1, wherein
the housing further comprises a third end portion and a fourth end portion arranged in a direction transversely crossing the first end portion and second end portion,
the pair of third portions is arranged apart on the third end portion and the fourth end portion, and
the reinforcing portion bridges between the third end portion and the fourth end portion, and joins the pair of third portions.

7. The electronic apparatus of claim 1, wherein
the reinforcing portion is fastened to an inner surface of the metal portion at the second end portion.

8. The electronic apparatus of claim 7, further comprising:
a second housing; and
a hinge joining the housing to the second housing, the hinge fastened to the metal portion via the reinforcing portion.

9. The electronic apparatus of claim 4, wherein
the reinforce portion is fastened to an inner surface of the metal portion.

10. The electronic apparatus of claim 4, wherein
the component comprises a long side along one end portion, and
the reinforcing portion is arranged along the one end portion.

11. The electronic apparatus of claim 4, wherein
the housing comprises a pair of end portions orthogonal to the one end portion,
the pair of the third portions is arranged apart on both end portions of the housing, and
the reinforcing portion bridges between the pair of end portions, and joins the pair of third portions.

12. The electronic apparatus of claim 4, wherein
the housing further comprises a first wall surrounding the opening and facing the first surface, and a second wall opposite to the first wall and facing the second surface,
the reinforcing portion is attached on an inner surface of the second wall, and comprises a projection configured to contact an inner surface of the first wall of the housing before the component contacts the inner surface of the housing when the housing is deformed.

13. The electronic apparatus of claim 9, further comprising:
a second housing; and
a hinge configured to connect the first housing and the second housing, wherein the hinge is on the metal portion.

14. An electronic apparatus comprising:
a housing comprising: a front cover with an opening, and a back cover comprising a synthetic resin portion, a metal portion, and a reinforcing portion; and
a display panel between the front cover and the back cover, the display panel comprising a first surface in the opening, a second surface opposite the first surface and facing the back cover, and a circuit board on the second surface, wherein
the synthetic resin portion comprises:
a first portion facing an outside of the electronic apparatus at a portion opposite to the circuit board;
a second portion next to the first portion and between the metal portion and the second surface of the panel; and
a pair of the third portions next to the second portion opposite the first portion at both sides of the circuit board,
the reinforcing portion connects tips of the pair of the third portions and defines an opening area by surrounding with the second portion and the third portions, and
the metal portion faces the second portion, the third portions, and the reinforcing portion from the outside of the electronic apparatus and covers the opening area.

* * * * *